US007215030B2

(12) United States Patent
Master et al.

(10) Patent No.: US 7,215,030 B2
(45) Date of Patent: May 8, 2007

(54) LEAD-FREE SEMICONDUCTOR PACKAGE

(75) Inventors: Raj N. Master, San Jose, CA (US); Srinivasan Ashok Anand, Marine Crescent (SG); Srinivasan Parthasarathy, Sunnyvale, CA (US); Yew Cheong Mui, Jalan Bahagia (SG)

(73) Assignee: Advanced Micro Devices, Inc., Sunnyvale, CA (US)

(*) Notice: Subject to any disclaimer, the term of this patent is extended or adjusted under 35 U.S.C. 154(b) by 10 days.

(21) Appl. No.: 11/167,425

(22) Filed: Jun. 27, 2005

(65) Prior Publication Data
US 2006/0289977 A1    Dec. 28, 2006

(51) Int. Cl.
*H01L 23/48*    (2006.01)
*H01L 23/52*    (2006.01)
*H01L 29/40*    (2006.01)

(52) U.S. Cl. .............. 257/772; 257/779; 257/697; 257/778; 257/780; 257/E23.023; 420/562

(58) Field of Classification Search ............... 257/772, 257/779, 778, 697, 780
See application file for complete search history.

(56) References Cited

U.S. PATENT DOCUMENTS

| 6,229,207 | B1 | 5/2001 | Master |
| 6,365,097 | B1 | 4/2002 | Yamashita et al. |
| 6,600,233 | B2* | 7/2003 | Yeoh et al. ............ 257/779 |
| 6,911,726 | B2* | 6/2005 | Rumer et al. ............ 257/697 |
| 7,102,230 | B2* | 9/2006 | Yang ............ 257/738 |
| 2001/0002982 | A1 | 6/2001 | Sarkhel et al. |
| 2002/0142517 | A1 | 10/2002 | Maeda et al. |
| 2002/0149113 | A1* | 10/2002 | Ray et al. ............ 257/772 |
| 2004/0052678 | A1 | 3/2004 | Takesue et al. |
| 2004/0155358 | A1* | 8/2004 | Iijima ............ 257/778 |
| 2004/0195701 | A1* | 10/2004 | Attarwala ............ 257/783 |
| 2004/0212094 | A1 | 10/2004 | Farooq et al. |
| 2005/0006789 | A1* | 1/2005 | Tomono et al. ............ 257/778 |
| 2005/0106059 | A1 | 5/2005 | Farooq et al. |

FOREIGN PATENT DOCUMENTS

| JP | 08 148496 | 6/1996 |
| WO | WO 99/04048 | 1/1999 |

OTHER PUBLICATIONS

Ning-Cheng Lee, "Lead-free soldering and low alpha solders for wafer level interconnects", vol. XP009075177, Sep. 2000.

* cited by examiner

*Primary Examiner*—Nitin Parekh
(74) *Attorney, Agent, or Firm*—Farjami & Farjami LLP

(57) ABSTRACT

A package substrate includes die solder pads and pin solder fillets. The pin solder fillets might comprise between approximately 90 wt % to approximately 99 wt % tin and approximately 10 wt % to 1 wt % antimony. The die solder pads might comprise between approximately 4 wt % to approximately 8 wt % bismuth, approximately 2 wt % to approximately 4 wt % silver, approximately 0 wt % to approximately 0.7 wt % copper, and approximately 87 wt % to approximately 92 wt % tin. The die solder pads might comprise between approximately 7 wt % to approximately 20 wt % indium, between approximately 2 wt % to approximately 4.5 wt % silver, between approximately 0 wt % to approximately 0.7 wt % copper, between approximately 0 wt % to approximately 0.5 wt % antimony, and between approximately 74.3 wt % to approximately 90 wt % tin.

8 Claims, 3 Drawing Sheets

Table 1

| Alloy (wt %) | Solidus (°C) | Liquidus (°C) |
| --- | --- | --- |
| 90 Sn/10 Sb | 241 | 247 |
| 95 Sn/5 Sb | 234 | 240 |
| 97 Sn/3 Sb | 232 | 238 |
| 99 Sn/1 Sb | 235 | 235 |

FIG. 2

Table 2

| Alloy (wt %) | Solidus (° C) | Liquidus (° C) |
|---|---|---|
| 87.0Sn/ 10.5In/ 2.1Ag/ 0.4Sb | 188 | 197 |
| 88.4Sn/4.1Ag/ 0.5Cu/ 7.0In | 202 | 207 |
| 77.2Sn/2.8Ag/20In | 175 | 185 |
| 86.9Sn/3.1Ag/ 10In | 204 | 205 |
| 90Sn/2Ag/0.5Cu/7.5Bi | 189 | 213 |
| 91.8Sn/3.4Ag/4.8Bi | 200 | 216 |

FIG. 3

LEAD-FREE SEMICONDUCTOR PACKAGE

1. TECHNICAL FIELD

The present relates generally to semiconductor device packaging, and more particularly to semiconductor packages with organic substrates.

2. BACKGROUND ART

The escalating requirements for high density and performance associated with ultra-large scale integration technology creates significant challenges for the design and implementation of electrical connections between circuit components and external electrical circuitry. Integrated circuit (IC) devices, whether individual active devices, individual passive devices, multiple active devices within a single chip, or multiple passive and active devices within a single chip, require suitable input/output (I/O) connections between themselves and other circuit elements or structures.

Device miniaturization and the ever increasing density of semiconductor devices require an ever increasing number of I/O terminals as well as improvements in the electrical connections. One technique that supports the increased device densities involves a shift from peripheral wire bonding to area array chip interconnects. An example of an area array interconnect packaging technology is the flip chip technology. In the flip chip technology, a large area array of solder bumps on the surface of the die directly couple the "flipped" die to respective solder pads on the surface of the package substrate. In one implementation, a large number of pin leads are soldered to respective solder fillets on the opposite surface of the package substrate, resulting in a pin grid array package. The pin grid array package accommodates an increased number of I/O terminals and provides electrical signals immediately below the chip.

Presently, lead (Pb) is used as a primary constituent of solder and, for example, up to 95 wt % of solder can be lead (Pb). Thus, the use of solder in solder bumps, solder pads on the die side of the package substrate, and solder fillets on the pin side of the package substrate, translates into a pervasive and extensive use of lead (Pb). However, an alternative to lead (Pb) is highly desirable since, for example, environmental regulations call for elimination of lead (Pb) in electronic circuits. This requirement creates significant challenges for replacing lead (Pb) in the solder materials. As shown in the example of a pin grid array discussed above, solder containing lead (Pb) is the most widely used interconnect material in semiconductor packaging technology.

However, replacing the long-established use of lead (Pb) in solder with other materials represents significant challenges. For example, the processing "temperature hierarchy" must be maintained, while reliable electrical contacts and mechanical connections need be made. As an example, in flip chip technology the processing temperature hierarchy dictates use of solder fillets for pin solder that have a reflow temperature, i.e. the temperature at which the solder is mobile enough to form an electrical connection, below an organic substrate decomposition temperature. Furthermore, solder used is solder pads on the die side of the package substrate should have a reflow temperature below the solder in the solder fillets used in pin solder.

Thus, there is need in the art for replacing the long-entrenched use of lead (Pb) in solder with other materials, while maintaining reliable electrical contacts and the required mechanical strength, and while also complying with the required processing temperature hierarchy in assembling a semiconductor package, such as assembling a flip chip in a pin grid array package with an organic substrate.

SUMMARY

The present invention is directed to a lead-free semiconductor package. The invention addresses and resolves the need in the art for replacing lead (Pb) in solder with other materials, while maintaining reliable electrical contacts and the required mechanical strength, and while also complying with the required processing temperature hierarchy in assembling a semiconductor package.

In one embodiment, the invention includes a package substrate with a number of die solder pads on the die side of the package substrate, and a number of pin solder fillets on the pin side of the package substrate. The die solder pads have a reflow temperature below that of the pin solder fillets, while the pin solder fillets in turn have a reflow temperature below a decomposition temperature of the package substrate. In one implementation of this embodiment, the pin solder fillets might comprise between approximately 90 wt % to approximately 99 wt % tin and approximately 10 wt % to 1 wt % antimony. In this implementation, the pin solder fillet reflow temperature is between approximately 235° C. and approximately 247° C., which is below a decomposition temperature of the package substrate, i.e. below approximately 275° C.

In one implementation, the die solder pads might comprise between approximately 4 wt % to approximately 8 wt % bismuth, approximately 2 wt % to approximately 4 wt % silver, approximately 0 wt % to approximately 0.7 wt % copper, and approximately 87 wt % to approximately 92 wt % tin. In yet another implementation, the die solder pads might comprise between approximately 7 wt % to approximately 20 wt % indium, between approximately 2 wt % to approximately 4.5 wt % silver, between approximately 0 wt % to approximately 0.7 wt % copper, between approximately 0 wt % to approximately 0.5 wt % antimony, and between approximately 74.3 wt % to approximately 90 wt % tin. In these implementations, the die solder pad reflow temperature is between approximately 170° C. and approximately 225° C. In all embodiments of the invention, both the pin solder fillet reflow temperature and the die solder pad reflow temperature are below a decomposition temperature of the package substrate, i.e. below approximately 275° C. Other features and advantages of the present invention will become more readily apparent to those of ordinary skill in the art after reviewing the following detailed description and accompanying drawings.

BRIEF DESCRIPTION OF THE DRAWINGS

FIG. 2 illustrates exemplary compositions of lead-free solder alloys together with their melting characteristics for forming pin solder fillets on a package substrate, in accordance with one embodiment of the invention.

FIG. 3 illustrates exemplary compositions of lead-free solder alloys together with their melting characteristics for forming die solder pads on a package substrate, in accordance with one embodiment of the invention.

DETAILED DESCRIPTION OF THE INVENTION

Figure 1:
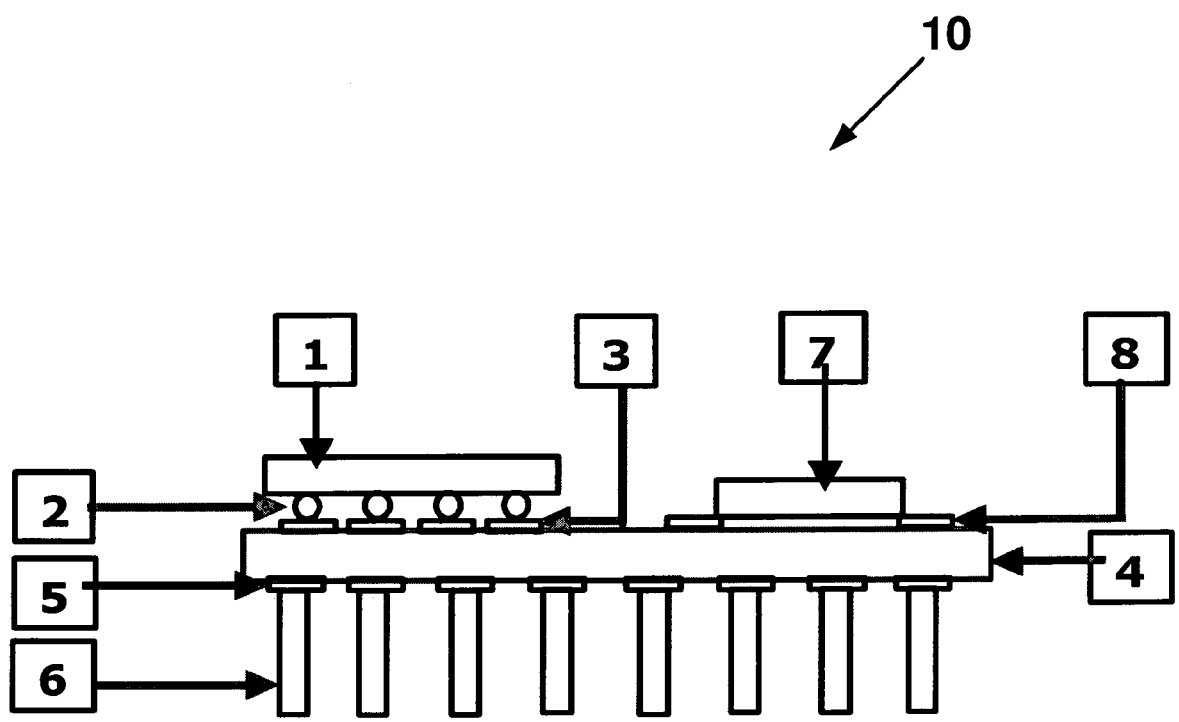
FIG. 1 shows an exemplary flip chip carrier package, including the package substrate, in accordance with one embodiment of the invention.

The present invention is directed to a lead-free semiconductor package. The following description contains specific information pertaining to the implementation of the present invention. One skilled in the art will recognize that the present invention may be implemented in a manner different from that specifically discussed in the present application. Moreover, some of the specific details of the invention are not discussed in order not to obscure the invention.

The drawings in the present application and their accompanying detailed description are directed to merely exemplary embodiments of the invention. To maintain brevity, other embodiments of the present invention are not specifically described in the present application and are not specifically illustrated by the present drawings. It should be borne in mind that, unless noted otherwise, like or corresponding elements among the figures may be indicated by like or corresponding reference numerals.

For the purpose of providing a specific example and for ease of illustration of the concepts of the present invention, the present application makes reference to a flip chip package having an organic package substrate. However, it is understood that the present invention is not limited to a flip chip package or to a package with an organic substrate. As illustrated in FIG. 1, flip chip carrier package 10 includes IC semiconductor device or IC die 1 mechanically and electrically attached to the die side of package substrate 4 by a number of solder bumps 2 connected in turn to corresponding die solder pads 3 on package substrate 4. Die solder pads 3 are electrically connected to I/O pin leads 6 by internal wiring (not shown) throughout package substrate 4. Pin leads 6 are soldered to the pin side of package substrate 4 by pin solder fillets 5. Pin leads 6 are used to provide electrical connections to external circuitry. Passive component 7 is attached to package substrate 4 using "passive solder pads 8" (a short hand reference to solder pads 8 used for attaching passive component 7 to package substrate 4).

In the absence of the present invention, solder bumps 2, die solder pads 3, pin solder fillets 5, and passive solder pads 8 contain approximately 30% to 97 wt % of lead (Pb) in the solder material. The present invention addresses and resolves the requirement to replace lead (Pb) in these solder points or to reduce the solders' lead (Pb) content to not more than approximately 0.1 wt %. The present invention also addresses and resolves challenges in finding and using suitable solder materials that can form electrically and mechanically reliable solder joints and have melting temperatures that fit the process temperature hierarchy in, for example, a flip chip assembly process.

The process temperature hierarchy in the flip chip assembly process requires assembly of pin leads 6 to be on the top of temperature hierarchy chain. The processing temperature for attaching pin leads 6 to organic package substrate 4 through pin solder fillets 5 should be higher than any other solder joints in the flip chip assembly, but should be below the decomposition temperature of organic package substrate 4 which can be, for example, approximately 275° C. The need for high reflow processing temperature for pin solder fillets 5 is due to the requirement that pin leads 6 should not move during subsequent assembly steps involving temperature.

The processing temperature for die solder pads 3 used in the IC die assembly process should be lower than the temperature used for pin solder fillets 5 in order to avoid the movement of pin leads 6 during the reflow process. Passive solder pads 8 used in the passive assembly should also have a processing temperature lower than that used for pin solder fillets 5 in order to prevent pin movement, and lower than or equal to die solder pads 3 used in the die assembly process. In order to prevent the melting of solder bumps 2, their melting temperature should be equal or greater than die solder pads 3 and passive solder pads 8.

One technique for mounting pin leads 6 onto the pin side surface of organic package substrate 4 involves using an appropriate solder alloy to coat metallized pads that serve as landing sites for pin leads 6. The pins are then positioned over the coated metallized pads, referred to as pin solder fillets 5 in the present application, and the solder is reflowed to join the pins to package substrate 4.

As stated above, one requirement for attaching pin leads 6 to the metallized pads, i.e. pin solder fillets 5, on organic package substrate 4 is that the soldering temperature cannot be higher than the decomposition temperature of organic package substrate 4, without adversely compromising the mechanical integrity of the organic substrate. According to various embodiments of the present invention, the lead-free solders employed for joining pin leads 6 to organic package substrate 4 form strong mechanical bonds capable of withstanding pulling, placement, or testing, i.e. socketing the assembled package, while preserving good electrical signal.

In accordance with one embodiment of the present invention, an organic substrate, such as organic package substrate 4 in FIG. 1, includes a number of pin leads 6 joined to respective conductive pads by lead-free pin solder fillets 5, thus achieving a solder system with no lead (Pb), or an undetectably low amount of lead (Pb), e.g. no greater than about 0.1 wt % lead (Pb). In one implementation, suitable solder compositions of the present invention can be formulated, for example, comprising about 90 wt % to about 99 wt % of tin (Sn), and about 10 wt % to about 1 wt % antimony (Sb).

In an embodiment of the present invention, pin solder fillets 5 on organic package substrate 4 have a reflow temperature, i.e. the temperature at which the solder is mobile enough to form an electrical connection, of greater than about 230° C., e.g. from about 235° C. to about 247° C. Hence, pin leads 6 can be mechanically and electrically joined to the metallized pads by reflowing pin solder fillets 5 at a temperature of from about 250° C. to about 270° C. Table 1 in FIG. 2 illustrates exemplary compositions of lead-free solder alloys together with their melting characteristics for forming pin solder fillets 5 on organic package substrate 4, in accordance with one embodiment of the present invention.

As illustrated in table 1 in FIG. 2, various compositions of solder alloy used in pin solder fillets 5 comprise about 90 wt % to about 99 wt % of tin (Sn), and about 10 wt % to about 1 wt % antimony (Sb), and have solidus temperatures ranging from 241° C. to 235° C. and liquidus temperatures ranging from 247° C. to 235° C. All of these solder alloy compositions have liquidus temperatures below the decomposition temperature of organic substrate package 4, i.e. below 275° C. Moreover, all of these solder alloy compositions used in pin solder fillets 5 have reflow temperatures higher than the reflow temperature for die solder pads 3 and passive solder pads 8. In one embodiment, the difference between the respective reflow temperatures of pin solder fillets 5 and die solder pads 3 is at least 10° C. to 15° C. In another embodiment, this difference is at least 5° C.

In another embodiment of the present invention, die solder pads 3 used for attaching IC die 1 to package substrate 4 are also lead-free, and further the lead-free die solder pads 3 have a reflow temperature below that of pin solder fillets 5, thus avoiding movement of pin leads 6. In this embodiment, die solder pads 3 situated on organic package substrate 4 comprise no lead (Pb) or an undetectably low amount of lead (Pb), for example less than about 0.1% lead (Pb).

According to this embodiment, various implementations of the present invention include suitable die solder pads 3 comprising between about 4 wt % to 8 wt % bismuth, between about 2 wt % to 4 wt % silver, between about 0 wt % to 0.7 wt % copper, and between about 87 wt % to 92 wt % tin. In other implementations of the present embodiment, die solder pads 3 comprise between about 7 wt % to 20 wt % indium, between about 2 wt % to 4.5 wt % silver, between about 0 wt % to 0.7 wt % copper, between about 0 wt % to 0.5 wt % antimony, and between about 74.3 wt % to 90 wt % tin.

According to the aforementioned embodiment of the invention, die solder pads 3 situated on organic package substrate 4 comprise no lead (Pb) or an undetectably low amount of lead (Pb), for example less than about 0.1% lead (Pb). Table 2 in FIG. 3, illustrates various exemplary compositions of solder alloy used in die solder pads 3 to achieve the advantages of the present embodiment. As discussed above, in accordance with this embodiment of the present invention and the specific exemplary implementations shown in table 2 of FIG. 3, new and novel solder alloys are utilized as die solder pads 3 for interconnecting IC die 1 to organic package substrate 4. In the various implementations of this embodiment, the solder used in die solder pads 3 have a reflow temperature, i.e. the temperature which the solder is mobile enough to form an electrical connection, of no less than 170° C. and no greater than 225° C.

More specifically, as illustrated in table 2 in FIG. 3, various compositions of solder alloy used in die solder pads 3 have solidus temperatures ranging from 175° C. to 204° C. and liquidus temperatures ranging from 185° C. to 216° C. All of these solder alloy compositions have liquidus temperatures well below the decomposition temperature of organic substrate package 4, i.e. below 275° C. Moreover, all of these solder alloy compositions used in die solder pads 3 have reflow temperatures below the reflow temperature for pin solder fillets 5, i.e. below 230° C.

Thus, there is need in the art for replacing the long-entrenched use of lead (Pb) in solder with other materials, while maintaining reliable electrical contacts and the required mechanical strength, and while also complying with the required processing temperature hierarchy in assembling a semiconductor package, such as assembling a flip chip in a pin grid array package with an organic substrate. From the above description of exemplary embodiments of the invention it is manifest that various techniques can be used for implementing the concepts of the present invention without departing from its scope. For example, while specific compositions of lead-free soldering materials and their corresponding reflow temperatures have been disclosed, other variations of the disclosed compositions manifestly fall within the scope of the present invention. Moreover, while the invention has been described with specific reference to certain embodiments, a person of ordinary skill in the art would recognize that changes could be made in form and detail without departing from the spirit and the scope of the invention. The described exemplary embodiments are to be considered in all respects as illustrative and not restrictive. It should also be understood that the invention is not limited to the particular exemplary embodiments described herein, but is capable of many rearrangements, modifications, and substitutions without departing from the scope of the invention.

Thus, a lead-free semiconductor package has been described.

The invention claimed is:

1. A package substrate having a die side and a pin side, a plurality of lead-free die solder pads being situated on said die side, and a plurality of lead-free pin solder fillets being situated on said pin side;

said plurality of lead-free die solder pads having a die solder pad reflow temperature and said plurality of lead-free pin solder fillets having a pin solder fillet reflow temperature, wherein said die solder pad reflow temperature is less than said pin solder fillet reflow temperature, and wherein said pin solder fillet reflow temperature is less than a decomposition temperature of said package substrate;

said plurality of lead-free pin solder fillets comprising between approximately 90 wt % to approximately 99 wt % tin and approximately 10 wt % to 1 wt % antimony.

2. The package substrate of claim 1 wherein said pin solder fillet reflow temperature is at least 230° C.

3. The package substrate of claim 1 wherein said pin solder fillet reflow temperature is between approximately 235° C. and approximately 247° C.

4. The package substrate of claim 1 wherein said decomposition temperature of said package substrate is at least 275° C.

5. The package substrate of claim 1 wherein said die solder pad reflow temperature is between approximately 170° C. and approximately 225° C.

6. The package substrate of claim 1 wherein a flip chip is situated on said die side.

7. The package substrate of claim 6 wherein said flip chip includes a plurality of lead-free solder bumps, wherein each of said plurality of lead-free solder bumps is attached to a corresponding one of said plurality of lead-free die solder pads.

8. The package substrate of claim 1 wherein a pin grid array is situated on said pin side, said pin grid array including a plurality of pin leads, each of said plurality of pin leads being attached to a corresponding one of said plurality of lead-free pin solder fillets.

* * * * *